United States Patent
Kishimoto et al.

(10) Patent No.: US 12,457,902 B2
(45) Date of Patent: Oct. 28, 2025

(54) PIEZOELECTRIC ELEMENT

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Masayuki Suzuki, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 898 days.

(21) Appl. No.: 17/694,730

(22) Filed: Mar. 15, 2022

(65) Prior Publication Data

US 2022/0209098 A1 Jun. 30, 2022

Related U.S. Application Data

(63) Continuation of application No. PCT/JP2020/021062, filed on May 28, 2020.

(30) Foreign Application Priority Data

Sep. 17, 2019 (JP) .................................. 2019-168109

(51) Int. Cl.
*H01L 41/09* (2006.01)
*H01L 41/047* (2006.01)
(Continued)

(52) U.S. Cl.
CPC ......... *H10N 30/2047* (2023.02); *H10N 30/06* (2023.02); *H10N 30/082* (2023.02); *H10N 30/8542* (2023.02); *H10N 30/87* (2023.02)

(58) Field of Classification Search
CPC ...... H10N 30/082; H10N 30/06; H10N 30/87; H10N 30/2047; H10N 30/8542
(Continued)

(56) References Cited

U.S. PATENT DOCUMENTS

| | | | |
|---|---|---|---|
| 2008/0028855 A1 | 2/2008 | Kano et al. | |
| 2009/0302716 A1 | 12/2009 | Ohara et al. | |
| 2014/0292159 A1* | 10/2014 | Takemura | H10N 30/87 29/25.35 |

FOREIGN PATENT DOCUMENTS

| | | | |
|---|---|---|---|
| JP | 2008-026274 A | 2/2008 | |
| JP | 2009-302661 A | 12/2009 | |

(Continued)

OTHER PUBLICATIONS

Official Communication issued in International Patent Application No. PCT/JP2020/021062, mailed on Aug. 4, 2020.
(Continued)

*Primary Examiner* — Emily P Pham
*Assistant Examiner* — Monica Mata
(74) *Attorney, Agent, or Firm* — Keating & Bennett, LLP

(57) ABSTRACT

A piezoelectric element includes a piezoelectric layer, a first electrode layer, a second electrode layer, and a connecting electrode. The piezoelectric layer includes first and second surfaces, and a through-hole. The second electrode layer is adjacent to the second surface of the piezoelectric layer. The second electrode layer faces the through-hole. The second electrode layer includes silicon as a major component. The connecting electrode is on a connecting surface of the second electrode layer, and the connecting surface faces the through-hole. The connecting electrode is made of a metal. A surface roughness of the connecting surface is greater than a surface roughness of a major surface. The major surface is a portion, other than the connecting surface, of a surface of the second electrode layer, and the surface is adjacent to the piezoelectric layer.

16 Claims, 5 Drawing Sheets

(51) Int. Cl.
    *H01L 41/187*     (2006.01)
    *H01L 41/29*     (2013.01)
    *H01L 41/332*     (2013.01)
    *H10N 30/06*     (2023.01)
    *H10N 30/082*     (2023.01)
    *H10N 30/20*     (2023.01)
    *H10N 30/853*     (2023.01)
    *H10N 30/87*     (2023.01)

(58) Field of Classification Search
    USPC .......................................................... 310/330
    See application file for complete search history.

(56) References Cited

FOREIGN PATENT DOCUMENTS

| | | |
|---|---|---|
| JP | 2010-118730 A | 5/2010 |
| JP | 2018-041788 A | 3/2018 |
| JP | 2018-056349 A | 4/2018 |
| KR | 960002562 A | 1/1996 |

OTHER PUBLICATIONS

Official Communication issued in corresponding Chinese Patent Application No. 202080064644.0, mailed on Nov. 19, 2024, 9 pages.

\* cited by examiner

PIEZOELECTRIC ELEMENT

CROSS REFERENCE TO RELATED APPLICATIONS

This application claims the benefit of priority to Japanese Patent Application No. 2019-168109 filed on Sep. 17, 2019 and is a Continuation Application of PCT Application No. PCT/JP2020/021062 filed on May 28, 2020. The entire contents of each application are hereby incorporated herein by reference.

BACKGROUND OF THE INVENTION

1. Field of the Invention

The present invention relates to a piezoelectric element.

2. Description of the Related Art

Configurations of piezoelectric elements are disclosed in Japanese Unexamined Patent Application Publication No. 2018-041788 and Japanese Unexamined Patent Application Publication No. 2009-302661. The piezoelectric element described in Japanese Unexamined Patent Application Publication No. 2018-041788 includes a piezoelectric thin film and a pair of electrodes. The piezoelectric thin film is disposed on a supporting substrate. The pair of electrodes are positioned with the piezoelectric thin film interposed therebetween. The electrode formed on the back side of the piezoelectric thin film is connected to a wiring electrode. The electrodes and a wiring electrode may be formed of a metal thin film.

The piezoelectric element described in Japanese Unexamined Patent Application Publication No. 2009-302661 includes a silicon substrate, a piezoelectric film, and a conductor film. The piezoelectric film is made of a piezoelectric material, such as aluminum nitride (AlN), and is disposed on the silicon substrate. The conductor film is made of a conductive material and disposed on the piezoelectric film. The conductor film is made of, for example, a metal or an alloy. The conductor film is positioned on the piezoelectric film and between portions of the piezoelectric film and is in contact with an n-type region of a silicon layer and the piezoelectric film.

In the piezoelectric element described in Japanese Unexamined Patent Application Publication No. 2018-041788, the wiring electrode and the electrode formed on the back side of the piezoelectric thin film are both formed of a metal material, and, therefore, adhesion between the wiring electrode and the electrode is ensured. However, in instances where one of the electrode layers includes silicon as a major component, as in the piezoelectric element described in Japanese Unexamined Patent Application Publication No. 2009-302661, adhesion between the electrode layer and the metal electrode is not sufficient, and, consequently, electrical resistance is increased at a bonding interface between the electrode layer and the metal electrode.

SUMMARY OF THE INVENTION

Preferred embodiments of the present invention provide piezoelectric elements in each of which an increase in electrical resistance is reduced or prevented at a bonding portion where an electrode layer that includes silicon as a major component is bonded to a connecting electrode made of a metal.

A piezoelectric element according to a preferred embodiment of the present invention includes a piezoelectric layer, a first electrode layer, a second electrode layer, and a connecting electrode. The piezoelectric layer includes a first surface, a second surface, and a through-hole. The second surface is opposed to the first surface. The through-hole extends from the first surface to the second surface. The first electrode layer is adjacent to the first surface of the piezoelectric layer. The second electrode layer is adjacent to the second surface of the piezoelectric layer. At least a portion of the second electrode layer opposed to the first electrode layer with the piezoelectric layer interposed therebetween. The second electrode layer faces the through-hole. The second electrode layer includes silicon as a major component. The connecting electrode is disposed on a connecting surface of the second electrode layer, and the connecting surface faces the through-hole. The connecting electrode is made of a metal. A surface roughness Ra of the connecting surface is greater than a surface roughness Ra of a major surface. The major surface is a portion, other than the connecting surface, of a surface of the second electrode layer, and the surface is adjacent to the piezoelectric layer.

According to preferred embodiments of the present invention, an increase in electrical resistance can be reduced or prevented at a bonding portion where a second electrode layer that includes silicon as a major component is bonded to a connecting electrode made of a metal.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
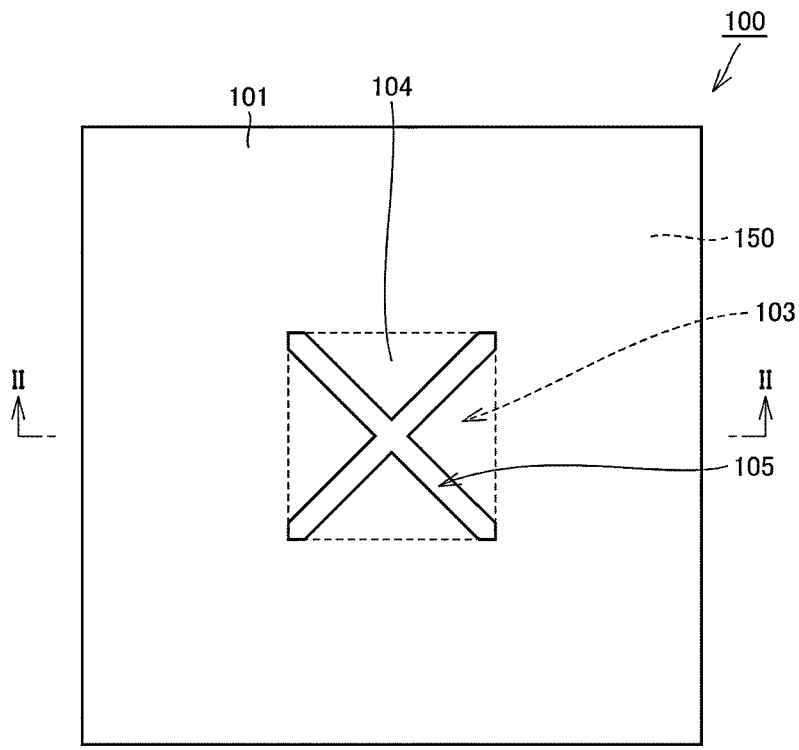
FIG. 1 is a schematic plan view of a piezoelectric element according to a first preferred embodiment of the present invention.

Piezoelectric elements according to preferred embodiments of the present invention will now be described with reference to the drawings. In the following descriptions of the preferred embodiments, the same reference characters will be used to refer to the same or corresponding portions and elements in the drawings, and descriptions thereof will not be repeated.

First Preferred Embodiment

Figure 2:
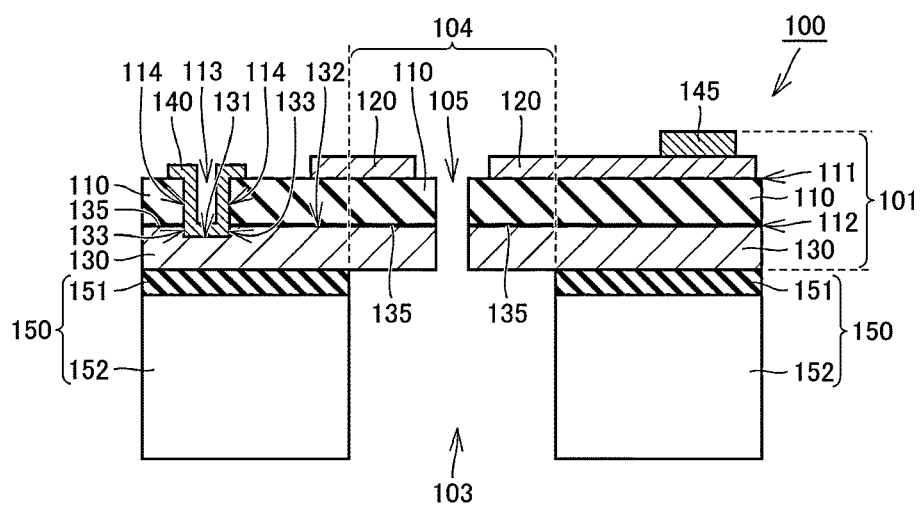
FIG. 2 is a cross-sectional view of the piezoelectric element of FIG. 1 taken along line II-II, as viewed in the direction of the arrow.

FIG. 1 is a schematic plan view of a piezoelectric element according to a first preferred embodiment of the present invention. FIG. 2 is a cross-sectional view of the piezoelectric element of FIG. 1 taken along line II-II, as viewed in the direction of the arrow.

As illustrated in FIGS. 1 and 2, a piezoelectric element 100 according to the first preferred embodiment of the present invention includes a piezoelectric layer 110, a first electrode layer 120, a second electrode layer 130, a connecting electrode 140, an external connecting electrode 145, and a base portion 150.

As illustrated in FIG. 2, the piezoelectric layer 110 includes a first surface 111, a second surface 112, and a through-hole 113. The second surface 112 is opposed to the first surface 111. The through-hole 113 extends from the first surface 111 to the second surface 112.

In the present preferred embodiment, the piezoelectric layer 110 is made of, for example, an alkali niobate-based compound or an alkali tantalate-based compound. In the present preferred embodiment, the alkali metal in the alkali niobate-based compound or the alkali tantalate-based compound includes at least one of, for example, lithium, rubidium, and cesium. Specifically, in the present preferred embodiment, the piezoelectric layer 110 is made of, for example, a single-crystal material including lithium niobate (LiNbO$_3$) or lithium tantalate (LiTaO$_3$). However, the piezoelectric layer 110 does not need to be made of a single-crystal material.

The first electrode layer 120 is disposed adjacent to the first surface 111 of the piezoelectric layer 110. An adhesion layer may be located between the first electrode layer 120 and the piezoelectric layer 110. The first electrode layer 120 is made of, for example, a metal such as Al or Pt. The adhesion layer is made of, for example, Ti or NiCr.

The second electrode layer 130 is located adjacent to the second surface 112 of the piezoelectric layer 110. At least a portion of the second electrode layer 130 is opposed to the first electrode layer 120 with the piezoelectric layer 110 interposed therebetween. In the present preferred embodiment, the second electrode layer 130 is opposed to the first electrode layer 120 with only the piezoelectric layer 110 and a natural oxide film layer, described later, originating from the second electrode layer 130 interposed therebetween.

The second electrode layer 130 faces the through-hole 113. A connecting surface 131 of the second electrode layer 130 faces the through-hole 113. Furthermore, the second electrode layer 130 faces the second surface 112 of the piezoelectric layer 110. A major surface 132 of the second electrode layer 130 faces the piezoelectric layer 110. The connecting surface 131 is located inward relative to the major surface 132 in the second electrode layer 130 in a direction perpendicular or substantially perpendicular to the second surface 112. A minimum distance between the connecting surface 131 and the major surface 132 in the direction perpendicular or substantially perpendicular to the second surface 112 is, for example, greater than or equal to about 5 nm. The minimum distance between the connecting surface 131 and the major surface 132 in the direction perpendicular or substantially perpendicular to the second surface 112 may be, for example, less than or equal to about 100 nm. Note that the minimum distance between the connecting surface 131 and the major surface 132 is a distance in the direction perpendicular or substantially perpendicular to the second surface 112 between a point located closest to the major surface 132 in the direction perpendicular or substantially perpendicular to the second surface 112, of all of the points on the connecting surface 131, and a point located closest to the connecting surface 131 in the direction perpendicular or substantially perpendicular to the second surface 112, of all of the points on the major surface 132. The second electrode layer 130 further includes internal surfaces 133 that connect the connecting surface 131 and the major surface 132 to each other in the direction perpendicular or substantially perpendicular to the second surface 112.

In the present preferred embodiment, the second electrode layer 130 includes, for example, silicon as a major component. Specifically, the second electrode layer 130 is, for example, a doped single-crystal silicon layer. In the second electrode layer 130, the major surface 132 is covered with a silicon oxide film 135. The silicon oxide film 135 has a film thickness of, for example, approximately less than or equal to about 2 nm. Furthermore, in the present preferred embodiment, the connecting surface 131 is not covered with the silicon oxide film 135. Note that in the present specification, the phrase "includes silicon as a major component" means "includes silicon in an amount of about 50 atm % or greater".

Figure 3:
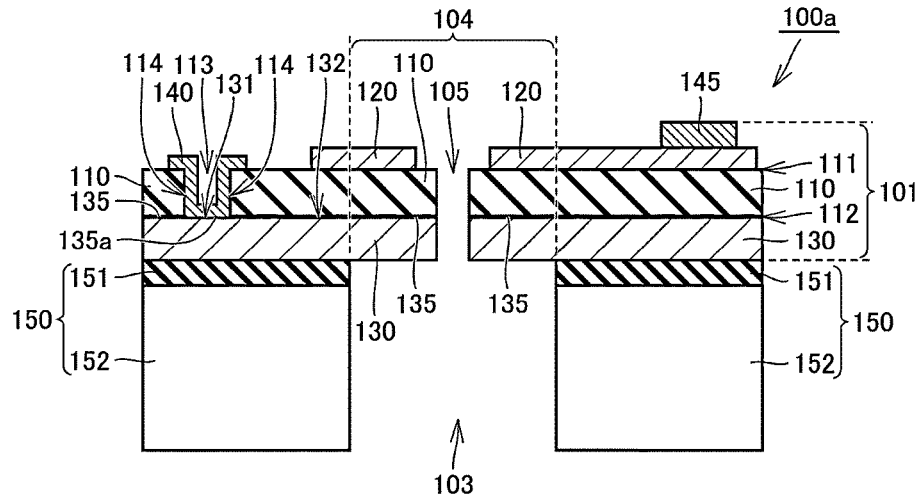
FIG. 3 is a cross-sectional view illustrating a configuration of a piezoelectric element according to a first modification of the first preferred embodiment of the present invention.

Note that the connecting surface 131 may be covered with a silicon oxide film that may be formed when silicon present in the second electrode layer 130 is naturally oxidized on a surface of the second electrode layer 130. FIG. 3 is a cross-sectional view illustrating a configuration of a piezoelectric element according to a first modification of the first preferred embodiment of the present invention. As illustrated in FIG. 3, in a piezoelectric element 100a according to the first modification of the first preferred embodiment of the present invention, the connecting surface 131 is covered with a silicon oxide film 135a. It should be noted that in this modification, the silicon oxide film 135a that covers the connecting surface 131 is thinner than the silicon oxide film 135 that covers the major surface 132. In this modification, the minimum distance between the connecting surface 131 and the major surface 132 in the direction perpendicular or substantially perpendicular to the second surface 112 is, for example, less than about 5 nm.

As illustrated in FIG. 2, in the piezoelectric element 100 according to the first preferred embodiment of the present invention, a surface roughness Ra of the connecting surface 131 is greater than a surface roughness Ra of the major surface 132. The major surface 132 is a portion, other than the connecting surface 131, of a surface of the second electrode layer 130, and the surface is adjacent to the piezoelectric layer 110. Specifically, the surface roughness Ra of the connecting surface 131 is, for example, about 30 nm or greater and less than about 1 µm. The surface roughness Ra of the major surface 132 is, for example, greater than about 0.05 nm and less than about 1 nm.

In the present preferred embodiment, the surface roughness Ra of the connecting surface 131 and the surface roughness Ra of the major surface 132 are calculated by directly examining a cross section of the piezoelectric element 100 taken perpendicular or substantially perpendicular to the major surface 132, with a transmission electron microscope (TEM). In the present specification, the surface roughness Ra is a value expressed in micrometers and determined as follows. From a roughness curve, only a reference length l is extracted in the direction of the mean line, and the roughness curve is expressed as y=f(x), with the X-axis being taken in the direction of the mean line of the extracted portion and the Y-axis being taken in the direction of longitudinal magnification of the extracted portion. The surface roughness Ra is then calculated by Equation (1) below. That is, in the present specification, the surface roughness Ra is defined according to JIS B 0601:2013. In the present preferred embodiment, the reference length l for the calculation of the surface roughness Ra is about 1 µm.

Equation (1)

$$Ra = \frac{1}{l}\int_0^l |f(x)|dx \quad (1)$$

As illustrated in FIG. 2, the connecting electrode 140 is disposed on the connecting surface 131 of the second electrode layer 130, which is a surface that faces the through-hole 113. The connecting electrode 140 is also disposed on the internal surfaces 133. The connecting electrode 140 is continuously disposed along the connecting surface 131, inner surfaces 114 of the through-hole 113, and the first surface 111. Accordingly, an outer edge of the connecting electrode 140 is located outside of the through-hole 113 when viewed in a direction perpendicular or substantially perpendicular to the first surface 111. Furthermore, a width of a portion of the connecting electrode 140 in a direction parallel or substantially parallel to the second surface 112, the portion being on the connecting surface 131, is greater than the minimum distance between the connecting surface 131 and the major surface 132 in the direction perpendicular or substantially perpendicular to the second surface 112. The width of the portion of the connecting electrode 140 on the connecting surface 131 in the direction parallel or substantially parallel to the second surface 112 is determined as follows: a cross section of the piezoelectric element 100 is taken perpendicular or substantially perpendicular to the second surface 112 such that a spacing between the inner surfaces 114 opposed to each other in the piezoelectric layer 110 is a minimum, and the cross section is directly examined with a transmission electron microscope (TEM) to measure a length of a portion of the connecting electrode 140 that is in contact with the connecting surface 131.

Figure 4:
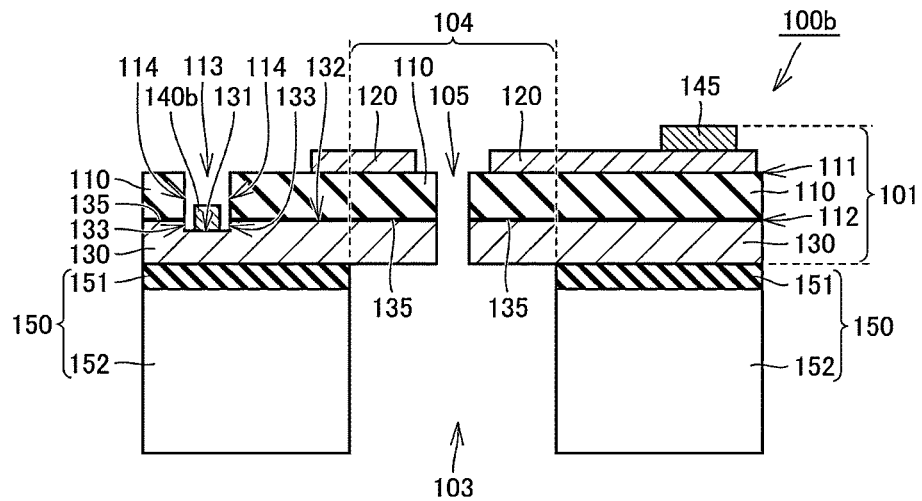
FIG. 4 is a cross-sectional view illustrating a configuration of a piezoelectric element according to a second modification of the first preferred embodiment of the present invention.

Note that the connecting electrode may be spaced away from the inner surfaces 114 of the through-hole 113. FIG. 4 is a cross-sectional view illustrating a configuration of a piezoelectric element according to a second modification of the first preferred embodiment of the present invention. In this modification, a connecting electrode 140b is spaced apart from the inner surfaces 114 of the through-hole 113, as illustrated in FIG. 4. A width of a portion of the connecting electrode 140b in the direction parallel or substantially parallel to the second surface 112, the portion being a portion on the connecting surface 131, is greater than a maximum distance between the connecting electrode 140b and the inner surfaces 114 of the through-hole 113.

As illustrated in FIG. 2, the connecting electrode 140 is made of a metal. The connecting electrode 140 is made of, for example, Au. An adhesion layer may be provided between the connecting electrode 140 and the second electrode layer 130. The adhesion layer is made of, for example, Ti or NiCr. Furthermore, the connecting electrode 140 is in ohmic contact with the connecting surface 131 of the second electrode layer 130.

In the present preferred embodiment, a multilayer body 101 includes at least the first electrode layer 120, the piezoelectric layer 110, and the second electrode layer 130, as illustrated in FIG. 2. The multilayer body 101 further includes the connecting electrode 140 and the external connecting electrode 145. The base portion 150 supports the multilayer body 101.

As illustrated in FIG. 2, the base portion 150 is located adjacent to the second electrode layer 130 of the multilayer body 101. As illustrated in FIG. 1, as viewed in a stacking direction of the multilayer body 101, the base portion 150 has a ring shape along a periphery of a surface of the multilayer body 101, which is a surface adjacent to the base portion 150.

In the present preferred embodiment, the base portion 150 includes a silicon oxide layer 151 and a base portion body 152, as illustrated in FIG. 2. The silicon oxide layer 151 is in contact with the second electrode layer 130. The base portion body 152 is in contact with the silicon oxide layer 151 on an opposite side of the silicon oxide layer 151 from the second electrode layer 130. In the present preferred embodiment, the base portion body 152 is made of, for example, single-crystal silicon, although the material of the base portion body 152 is not particularly limited.

As illustrated in FIG. 2, an opening 103 is located inward of the base portion 150 as viewed in the stacking direction of the multilayer body 101. As illustrated in FIG. 1, the opening 103 includes an edge with a rectangular or substantially rectangular outer shape as viewed in the stacking direction and extends in the stacking direction. Furthermore, the outer shape of the opening 103 is not particularly limited.

In the present preferred embodiment, the multilayer body 101 includes a membrane portion 104, as illustrated in FIGS. 1 and 2. The membrane portion 104 overlaps the opening 103 and does not overlap the base portion 150, as viewed in the stacking direction. The multilayer body 101 has a through-slit 105 communicating with the opening 103 located inward of the base portion 150 as viewed in the stacking direction. More specifically, the through-slit 105 is disposed in the membrane portion 104.

In the piezoelectric element 100 according to the present preferred embodiment, applying a voltage between the external connecting electrode 145 and the connecting electrode 140, illustrated in FIG. 2, causes a voltage to be applied between the first electrode layer 120 and the second electrode layer 130, illustrated in FIG. 2. Accordingly, the piezoelectric layer 110 located between the first electrode layer 120 and the second electrode layer 130 is actuated to deform. Accordingly, the membrane portion 104 can flexurally vibrate significantly in the stacking direction of the multilayer body 101.

A non-limiting example of a method for manufacturing the piezoelectric element according to the first preferred embodiment of the present invention will now be described. The states illustrated in FIGS. 5 to 11, described below, are presented in cross-sectional views as in FIG. 2.

Figure 5:
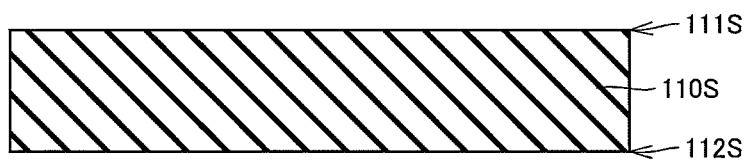
FIG. 5 is a cross-sectional view of a piezoelectric substrate provided in a method for manufacturing the piezoelectric element according to the first preferred embodiment of the present invention.

FIG. 5 is a cross-sectional view of a piezoelectric substrate provided in the method for manufacturing the piezoelectric element according to the first preferred embodiment of the present invention. As illustrated in FIG. 5, a piezoelectric substrate 110S includes a first major surface 111S and a second major surface 112S opposed to the first major surface 111S.

Figure 6:
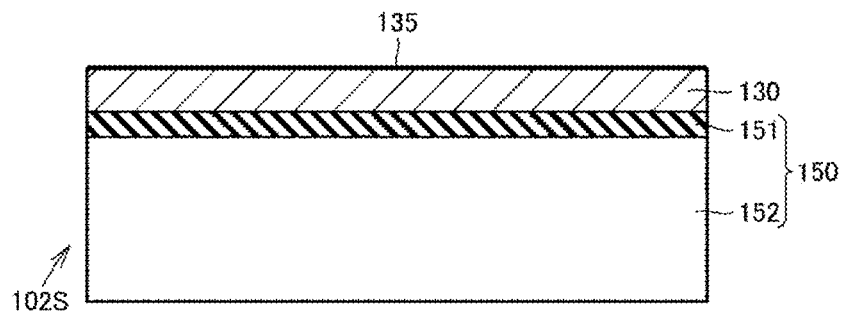
FIG. 6 is a cross-sectional view of a multilayer substrate, including a second electrode layer, provided in the method for manufacturing the piezoelectric element according to the first preferred embodiment of the present invention.

FIG. 6 is a cross-sectional view of a multilayer substrate, including a second electrode layer, provided in the method for manufacturing the piezoelectric element according to the first preferred embodiment of the present invention. As illustrated in FIG. 6, a multilayer substrate 102S that includes a second electrode layer 130 and a base portion 150 is provided. In the present preferred embodiment, the multilayer substrate 102S is, for example, a silicon-on-insulator (SOI) substrate.

Figure 7:
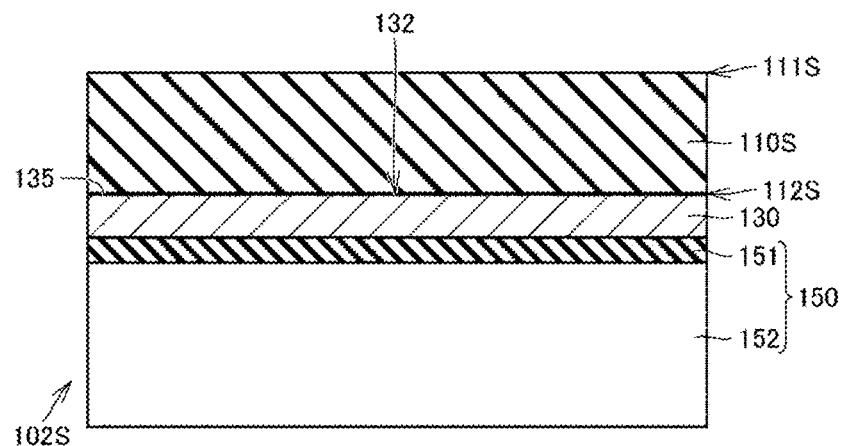
FIG. 7 is a cross-sectional view illustrating a state in which the piezoelectric substrate is bonded to the multilayer substrate including the second electrode layer, in the method for manufacturing the piezoelectric element according to the first preferred embodiment of the present invention.

FIG. 7 is a cross-sectional view illustrating a state in which the piezoelectric substrate is bonded to the multilayer substrate including the second electrode layer, in the method for manufacturing the piezoelectric element according to the first preferred embodiment of the present invention. As illustrated in FIG. 7, the piezoelectric substrate 110S is bonded to the multilayer substrate 102S using, for example, surface activated bonding or atomic diffusion bonding. Specifically, the piezoelectric substrate 110S is bonded to the second electrode layer 130. More specifically, the piezoelectric substrate 110S is bonded onto a silicon oxide film 135 on the second electrode layer 130.

Figure 8:
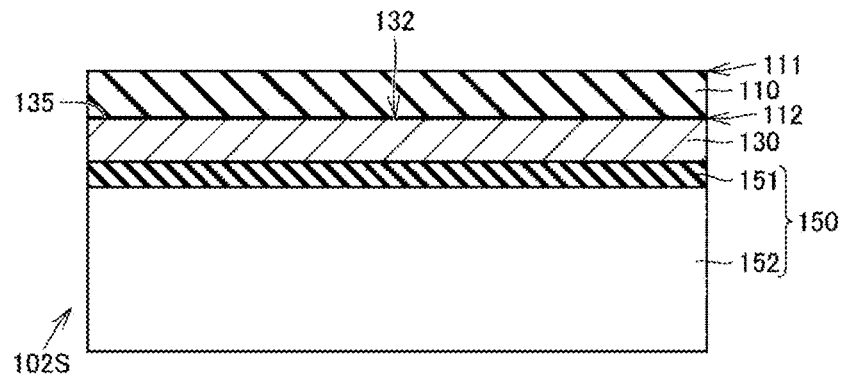
FIG. 8 is a cross-sectional view illustrating a state in which a piezoelectric layer is formed by grinding the piezoelectric substrate, in the method for manufacturing the piezoelectric element according to the first preferred embodiment of the present invention.

FIG. 8 is a cross-sectional view illustrating a state in which a piezoelectric layer is formed by, for example, grinding the piezoelectric substrate, in the method for manufacturing the piezoelectric element according to the first preferred embodiment of the present invention. As illustrated in FIG. 8, a piezoelectric layer 110 is formed by, for example, performing grinding and polishing using chemical mechanical polishing (CMP) on the piezoelectric substrate 110S.

When the piezoelectric substrate 110S is to be ground, a release layer may be formed on the first major surface 111S side of the piezoelectric substrate 110S by implanting ions thereinto in advance. In the instance where the release layer is formed before the piezoelectric substrate 110S is bonded to the second electrode layer 130, the piezoelectric layer 110 can be formed by removing the release layer after bonding. The piezoelectric layer 110 may be formed by grinding the release layer, for example, by performing grinding and CMP.

Figure 9:
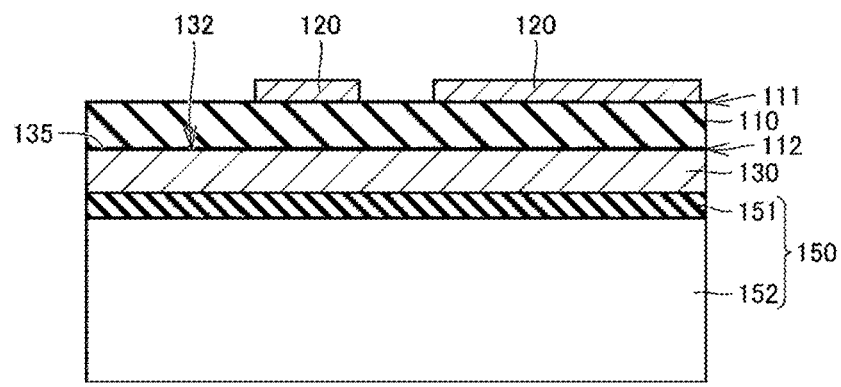
FIG. 9 is a cross-sectional view illustrating a state in which a first electrode layer is provided, in the method for manufacturing the piezoelectric element according to the first preferred embodiment of the present invention.

FIG. 9 is a cross-sectional view illustrating a state in which a first electrode layer is provided, in the method for manufacturing the piezoelectric element according to the first preferred embodiment of the present invention. As illustrated in FIG. 9, a first electrode layer 120 is formed on a first surface 111 of the piezoelectric layer 110 using, for example, a photolithography process, a deposition and lift-off process, or the like such that a desired pattern is obtained.

Figure 10:
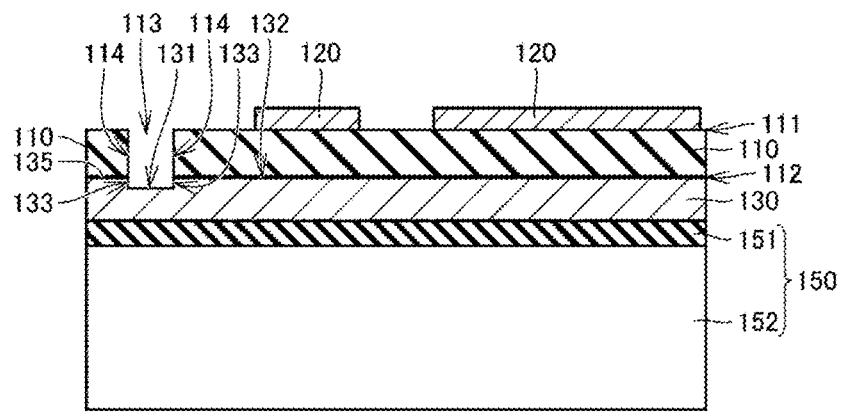
FIG. 10 is a cross-sectional view illustrating a state in which a through-hole is provided, in the method for manufacturing the piezoelectric element according to the first preferred embodiment of the present invention.

FIG. 10 is a cross-sectional view illustrating a state in which a through-hole is provided, in the method for manufacturing the piezoelectric element according to the first preferred embodiment of the present invention. As illustrated in FIG. 10, a through-hole 113 is provided in the piezoelectric layer 110, for example, by etching such as reactive ion etching (RIE). In this instance, a portion of a region of the second electrode layer 130 that faces the through-hole 113 is etched away while the through-hole 113 is formed. Accordingly, a connecting surface 131 is formed in an exposed manner, such that an entirety or substantially an entirety of the silicon oxide film 135 of the second electrode layer 130 has been removed therefrom. The etching is to be performed such that the connecting surface 131 has a desired surface roughness Ra. In the first modification of the first preferred embodiment of the present invention, it is sufficient that a portion of the silicon oxide film 135 of the second electrode layer 130 is removed.

Figure 11:
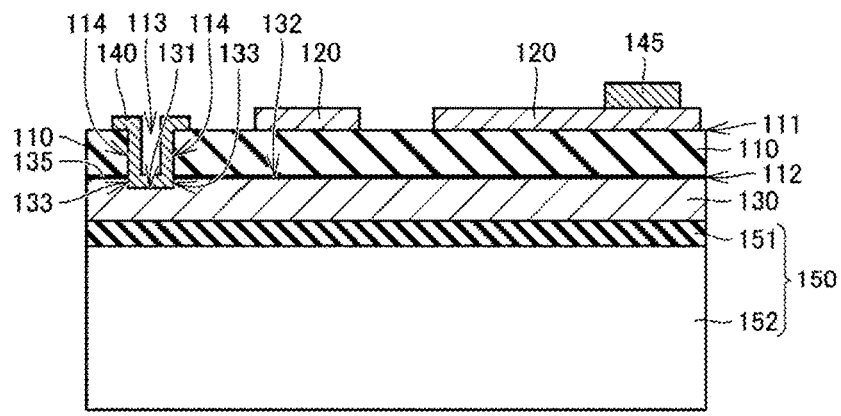
FIG. 11 is a cross-sectional view illustrating a state in which a connecting electrode is provided, in the method for manufacturing the piezoelectric element according to the first preferred embodiment of the present invention.

FIG. 11 is a cross-sectional view illustrating a state in which a connecting electrode is provided, in the method for manufacturing the piezoelectric element according to the first preferred embodiment of the present invention. As illustrated in FIG. 11, a connecting electrode 140 and an external connecting electrode 145 are formed by, for example, a photolithography process, a deposition and lift-off process, or the like.

Next, a through-slit 105 is formed in a multilayer body 101 by, for example, using RIE. Furthermore, a base portion body 152 is etched from an opposite side of the base portion 150 from the second electrode layer 130 by, for example, deep reactive ion etching (deep RIE). Lastly, a silicon oxide layer 151 is etched by using RIE to form an opening 103.

With the steps described above, the piezoelectric element 100 according to the first preferred embodiment of the present invention, as illustrated in FIGS. 1 and 2, is manufactured.

As described above, in the piezoelectric element 100 according to the first preferred embodiment of the present invention, the piezoelectric layer 110 includes the first surface 111, the second surface 112, and the through-hole 113. The through-hole 113 extends from the first surface 111 to the second surface 112. The second electrode layer 130 is located adjacent to the second surface 112 of the piezoelectric layer 110. The second electrode layer 130 faces the through-hole 113. The second electrode layer 130 includes, for example, silicon as a major component. The connecting electrode 140 is disposed on the connecting surface 131 of the second electrode layer 130, which is a surface that faces the through-hole 113. The connecting electrode 140 is made of a metal. The surface roughness Ra of the connecting surface 131 is greater than the surface roughness Ra of the major surface 132. The major surface 132 is a portion, other than the connecting surface 131, of a surface of the second electrode layer 130, and the surface is adjacent to the piezoelectric layer 110.

As a result, at the connecting surface 131, adhesion between the second electrode layer 130, which includes, for example, silicon as a major component, and the connecting electrode 140, which is made of a metal, is improved. Thus, an increase in electrical resistance can be reduced or prevented at the bonding portion where the second electrode layer 130 is bonded to the connecting electrode 140.

In the present preferred embodiment, the connecting surface 131 is located inward relative to the major surface 132 in the second electrode layer 130 in the direction perpendicular or substantially perpendicular to the second surface 112.

Since the surface of the second electrode layer 130 located adjacent to the piezoelectric layer 110 is processed such that the connecting surface 131 is located as described above, a natural oxide film layer originating from the second electrode layer 130 at the connecting surface 131 is removed. As a result, contact resistance between the second electrode layer 130 and the connecting electrode 140 at the connecting surface 131 can be reduced.

In the piezoelectric element 100 according to the first preferred embodiment of the present invention and the piezoelectric element 100a according to the first modification of the first preferred embodiment of the present invention, the major surface 132 is covered with the silicon oxide film 135. The connecting surface 131 is not covered with a silicon oxide film or is covered with a silicon oxide film 135a. The silicon oxide film 135a that covers the connecting surface 131 is thinner than the silicon oxide film 135 that covers the major surface 132.

As a result, the contact resistance between the second electrode layer 130 and the connecting electrode 140 can be reduced.

In the piezoelectric element 100 according to the first preferred embodiment of the present invention, the minimum distance between the connecting surface 131 and the major surface 132 in the direction perpendicular or substantially perpendicular to the second surface 112 is, for example, greater than or equal to about 5 nm.

Since the major surface 132 of the second electrode layer 130 is processed such that the connecting surface 131 and the major surface 132 are sufficiently spaced away from each other as described above, the natural oxide film layer originating from the second electrode layer 130 at the connecting surface 131 is sufficiently removed. As a result, the contact resistance between the second electrode layer 130 and the connecting electrode 140 at the connecting surface 131 can be sufficiently reduced.

In the present preferred embodiment, the surface roughness Ra of the connecting surface 131 is, for example, about 30 nm or greater and less than about 1 μm. The surface roughness Ra of the major surface 132 is, for example, less than about 1 nm.

When the surface roughness Ra of the connecting surface 131 is about 20 nm or greater and less than about 1 μm, adhesion between the second electrode layer 130 and the connecting electrode 140 is further improved, which reduces the contact resistance between the second electrode layer 130 and the connecting electrode 140. Furthermore, when the surface roughness Ra of the major surface 132 is less than about 1 nm, bonding strength between the piezoelectric layer 110 and the second electrode layer 130 is improved.

In the present preferred embodiment, the surface roughness Ra of the major surface 132 is, for example, greater than about 0.05 nm. As such, it is easy to set the surface roughness Ra of the major surface such that the bonding strength between the piezoelectric layer 110 and the second electrode layer 130 can be improved.

In the present preferred embodiment, the width of a portion of the connecting electrode 140 in the direction parallel or substantially parallel to the second surface 112, the portion being a portion on the connecting surface 131, is greater than the minimum distance between the connecting surface 131 and the major surface 132 in the direction perpendicular to the second surface 112.

Accordingly, on the connecting surface 131, which has a surface roughness Ra as described above, an area of contact between the connecting electrode 140 and the second electrode layer 130 can be increased, which in turn reduces the contact resistance between the connecting electrode 140 and the second electrode layer 130.

In the present preferred embodiment, the second electrode layer 130 further includes the internal surfaces 133 that connect the connecting surface 131 and the major surface 132 to each other in the direction perpendicular to the second surface 112. The connecting electrode 140 is also disposed on the internal surfaces 133.

Accordingly, the connecting electrode 140 and the second electrode layer 130 are also bonded to each other at the internal surfaces 133, and, consequently, adhesion between the second electrode layer 130 and the connecting electrode 140 is further improved.

In the present preferred embodiment, the connecting electrode 140 is in ohmic contact with the connecting surface 131 of the second electrode layer 130.

Accordingly, no Schottky barrier exists between the connecting electrode 140 and the second electrode layer 130, and, therefore, the contact resistance between the connecting electrode 140 and the second electrode layer 130 is reduced, which improves the electromechanical conversion efficiency of the piezoelectric element 100.

In the present preferred embodiment, the connecting electrode 140 is continuously disposed along the connecting surface 131, the inner surfaces 114 of the through-hole 113, and the first surface 111.

Accordingly, an electrode extending from the second electrode layer 130 can be provided together with the first electrode layer 120 on the first surface 111. Thus, an outer electrode (not illustrated) to be connected to the connecting electrode 140 can be efficiently routed.

In the present preferred embodiment, the second electrode layer 130 is, for example, a doped single-crystal silicon layer. When the second electrode layer 130 is made of, for example, a single-crystal, the bonding strength to the piezoelectric layer 110 is improved, which improves the electromechanical conversion efficiency of the piezoelectric element 100. Furthermore, the electrical resistance of the second electrode layer 130 can be reduced compared with instances in which the second electrode layer 130 is made of an undoped single-crystal silicon layer.

In the present preferred embodiment, the piezoelectric layer 110 is made of, for example, a single-crystal material including lithium niobate ($LiNbO_3$) or lithium tantalate ($LiTaO_3$). As a result, the bonding strength between the piezoelectric layer 110 and the second electrode layer 130 is improved, which improves the electromechanical conversion efficiency of the piezoelectric element 100.

In the present preferred embodiment, the piezoelectric element 100 further includes the base portion 150 that supports the multilayer body 101, which includes at least the first electrode layer 120, the piezoelectric layer 110, and the second electrode layer 130. The base portion 150 is located adjacent to the second electrode layer 130 of the multilayer body 101, and, as viewed in a stacking direction of the multilayer body 101, the base portion 150 has a ring shape along a periphery of a surface of the multilayer body 101, which is a surface adjacent to the base portion 150.

Accordingly, the actuation of the piezoelectric layer 110 can be converted into flexural vibration of the membrane portion 104, and, consequently, the device characteristics of the piezoelectric element 100 can be improved.

In the present preferred embodiment, the multilayer body 101 includes the through-slit 105 communicating with the opening 103 located inward of the base portion 150 as viewed in the stacking direction.

As a result, the flexural vibration of the membrane portion 104 is further increased, and, consequently, the device characteristics of the piezoelectric element 100 can be improved.

Furthermore, in the piezoelectric element 100b according to the second modification of the first preferred embodiment of the present invention, the width of a portion of the connecting electrode 140b in the direction parallel or substantially parallel to the second surface 112, the portion being on the connecting surface 131, is greater than the maximum distance between the connecting electrode 140b and the inner surfaces 114 of the through-hole 113.

Accordingly, on the connecting surface 131, the area of contact between the connecting electrode 140 and the second electrode layer 130 is increased, which reduces the contact resistance between the connecting electrode 140 and the second electrode layer 130.

Second Preferred Embodiment

A piezoelectric element according to a second preferred embodiment of the present invention will now be described. The piezoelectric element according to the second preferred embodiment of the present invention differs from the piezoelectric element according to the first preferred embodiment of the present invention primarily in that the piezoelectric element according to the second preferred embodiment includes an intermediate layer. Accordingly, descriptions of features the same as or similar to those of the piezoelectric element 100 according to the first preferred embodiment of the present invention will not be repeated.

Figure 12:
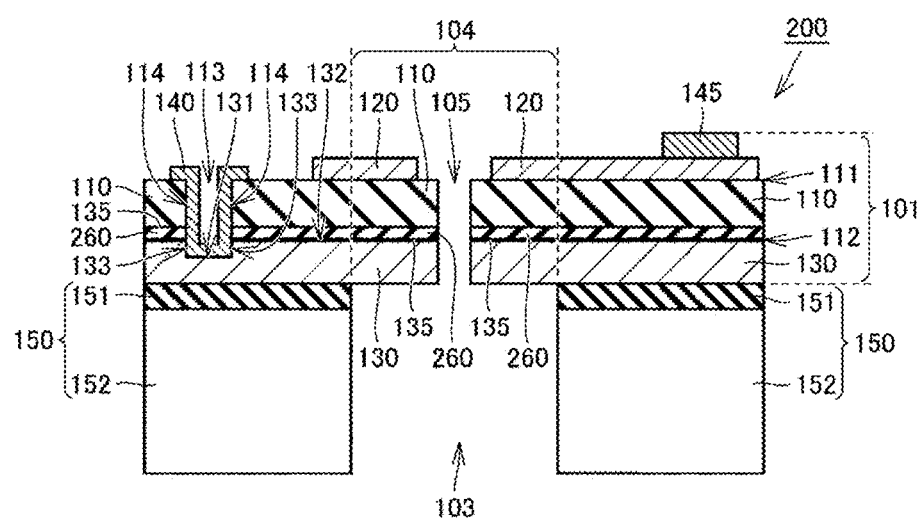
FIG. 12 is a cross-sectional view illustrating a configuration of a piezoelectric element according to a second preferred embodiment of the present invention.

FIG. 12 is a cross-sectional view illustrating a configuration of the piezoelectric element according to the second preferred embodiment of the present invention. In FIG. 12, the illustration is presented in a cross-sectional view as in FIG. 2.

In a piezoelectric element 200 according to the second preferred embodiment of the present invention, an intermediate layer 260 is between a second electrode layer 130 and a piezoelectric layer 110. As a result, the bonding strength between the second electrode layer 130 and the piezoelectric layer 110 is improved. The intermediate layer 260 may be a metal layer or a dielectric layer including, for example, $SiO_2$. In the present preferred embodiment, a through-hole is provided in the intermediate layer 260, and the through-hole is continuous with the through-hole 113 disposed in the piezoelectric layer 110.

In each of the preferred embodiments described above, a state of contact between the connecting electrode and the second electrode layer can be evaluated according to behavior exhibited by the membrane portion when a voltage is applied between the upper electrode layer and the lower electrode layer.

In the descriptions of the above preferred embodiments, features that can be combined may be combined together.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element comprising:
   a piezoelectric layer including a first surface, a second surface opposed to the first surface, and a through-hole extending from the first surface to the second surface;
   a first electrode layer adjacent to the first surface of the piezoelectric layer;
   a second electrode layer adjacent to the second surface of the piezoelectric layer, at least a portion of the second electrode layer being opposed to the first electrode layer with the piezoelectric layer interposed therebetween, the second electrode layer facing the through-hole; and
   a connecting electrode on a connecting surface of the second electrode layer, the connecting surface facing the through-hole;
   wherein
   the second electrode layer includes silicon as a major component;
   the connecting electrode is made of a metal; and
   a surface roughness Ra of the connecting surface is greater than a surface roughness Ra of a major surface, the major surface being a portion, other than the connecting surface, of a surface of the second electrode layer, the surface being adjacent to the piezoelectric layer.

2. The piezoelectric element according to claim 1, wherein the connecting surface is located inward relative to the major surface in the second electrode layer in a direction perpendicular or substantially perpendicular to the second surface.

3. The piezoelectric element according to claim 2, wherein
   the major surface is covered with a silicon oxide film;
   the connecting surface is not covered with a silicon oxide film or is covered with a silicon oxide film; and
   the silicon oxide film covering the connecting surface is thinner than the silicon oxide film that covers the major surface.

4. The piezoelectric element according to claim 2, wherein a minimum distance between the connecting surface and the major surface in the direction perpendicular or substantially perpendicular to the second surface is greater than or equal to about 5 nm.

5. The piezoelectric element according to claim 1, wherein
   the surface roughness Ra of the connecting surface is about 30 nm or greater and less than about 1 μm; and
   the surface roughness Ra of the major surface is less than about 1 nm.

6. The piezoelectric element according to claim 5, wherein the surface roughness Ra of the major surface is greater than about 0.05 nm.

7. The piezoelectric element according to claim 4, wherein a width of a portion of the connecting electrode on the connecting surface in a direction parallel or substantially parallel to the second surface is greater than the minimum distance between the connecting surface and the major surface in the direction perpendicular to the second surface.

8. The piezoelectric element according to claim 2, wherein a width of a portion of the connecting electrode on the connecting surface in a direction parallel or substantially parallel to the second surface is greater than a maximum distance between the connecting electrode and an inner surface of the through-hole.

9. The piezoelectric element according to claim 2, wherein
   the second electrode layer includes an internal surface connecting the connecting surface and the major surface to each other in the direction perpendicular or substantially perpendicular to the second surface; and
   the connecting electrode is on the internal surface.

10. The piezoelectric element according to claim 1, wherein the connecting electrode is in ohmic contact with the connecting surface of the second electrode layer.

11. The piezoelectric element according to claim 1, wherein the connecting electrode extends continuously along the connecting surface, the inner surface of the through-hole, and the first surface.

12. The piezoelectric element according to claim 1, wherein the second electrode layer includes a doped single-crystal silicon layer.

13. The piezoelectric element according to claim 1, wherein the piezoelectric layer is made of a single-crystal material including lithium niobate or lithium tantalate.

14. The piezoelectric element according to claim 1, wherein an intermediate layer is between the second electrode layer and the piezoelectric layer.

15. The piezoelectric element according to claim 1, further comprising:
- a base portion supporting a multilayer body including at least the first electrode layer, the piezoelectric layer, and the second electrode layer; wherein
- the base portion is adjacent to the second electrode layer of the multilayer body, and, as viewed in a stacking direction of the multilayer body, the base portion has a ring shape along a periphery of a surface of the multilayer body, the surface being a surface adjacent to the base portion.

16. The piezoelectric element according to claim 15, wherein the multilayer body includes a through-slit communicating with an opening located inward of the base portion as viewed in the stacking direction.

* * * * *